(12) United States Patent
Hongo et al.

(10) Patent No.: US 10,677,502 B2
(45) Date of Patent: Jun. 9, 2020

(54) HEAT TRANSPORT APPARATUS

(71) Applicant: Kabushiki Kaisha Toshiba, Tokyo (JP)

(72) Inventors: Takuya Hongo, Kanagawa (JP); Rei Kimura, Tokyo (JP); Tomonao Takamatsu, Kanagawa (JP); Chikako Iwaki, Tokyo (JP); Hideki Horie, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 144 days.

(21) Appl. No.: 15/893,811

(22) Filed: Feb. 12, 2018

(65) Prior Publication Data

US 2019/0078815 A1    Mar. 14, 2019

(30) Foreign Application Priority Data

Sep. 14, 2017   (JP) .................. 2017-176967

(51) Int. Cl.
*F25B 39/00*        (2006.01)
*F28D 15/00*        (2006.01)
(Continued)

(52) U.S. Cl.
CPC ............ *F25B 39/00* (2013.01); *F25B 23/006* (2013.01); *F25B 47/006* (2013.01); *F28D 15/025* (2013.01); *F28D 15/0258* (2013.01); *F28D 15/0266* (2013.01); *F28D 15/0275* (2013.01); *F28D 15/0283* (2013.01); *F28D 15/06* (2013.01); *G21C 15/02* (2013.01); *G21C 15/28* (2013.01); *H01L 23/427* (2013.01); *F25B 39/02* (2013.01); *F25B 39/04* (2013.01);
(Continued)

(58) Field of Classification Search
CPC .......... F25B 39/00; F25B 39/02; F25B 39/04; F25B 47/006; F25B 2600/027; F28D 15/02; F28D 15/0266
See application file for complete search history.

(56) References Cited

U.S. PATENT DOCUMENTS 5,313,787 A  *  5/1994  Martin .................. F25D 29/001
                                                              62/222
8,658,918 B1 *  2/2014  Li ........................... F01K 25/08
                                                              200/2

(Continued)

FOREIGN PATENT DOCUMENTS

JP          02-110295          4/1990
JP         2008-286480         11/2008
(Continued)

*Primary Examiner* — Marc E Norman
(74) *Attorney, Agent, or Firm* — Finnegan, Henderson, Farabow, Garrett & Dunner, L.L.P.

(57) ABSTRACT

According to one embodiment, a heat transport apparatus includes an evaporator, a cooling unit, a channel structure, and a heating mechanism. The evaporator vaporizes a refrigerant by heat generated by a heat-generating element. The cooling unit is provided above the evaporator and cools and condenses the refrigerant vaporized in the evaporator. The channel structure constitutes a channel through which the refrigerant circulates between the evaporator and the cooling unit. The heating mechanism heats the cooling unit and suppresses solidification of the refrigerant at the cooling unit.

13 Claims, 6 Drawing Sheets

(51) Int. Cl.
  *F25B 47/00*    (2006.01)
  *F28D 15/02*    (2006.01)
  *G21C 15/02*    (2006.01)
  *G21C 15/28*    (2006.01)
  *F25B 23/00*    (2006.01)
  *H01L 23/427*   (2006.01)
  *F28D 15/06*    (2006.01)
  *F25B 39/04*    (2006.01)
  *F25B 39/02*    (2006.01)
  *F28D 21/00*    (2006.01)

(52) U.S. Cl.
  CPC  *F25B 2600/027* (2013.01); *F28D 2021/0029* (2013.01); *F28D 2021/0054* (2013.01)

(56) References Cited

U.S. PATENT DOCUMENTS

| | | | |
|---|---|---|---|
| 2010/0011787 A1* | 1/2010 | Lifson | F25B 9/008 62/77 |
| 2010/0040187 A1 | 2/2010 | Ahlfeld et al. | |
| 2013/0068215 A1* | 3/2013 | Neuhauser | F28D 15/0266 126/400 |

FOREIGN PATENT DOCUMENTS

| | | |
|---|---|---|
| JP | 2009-250929 | 10/2009 |
| JP | 2011-530713 | 12/2011 |
| JP | 2016-164478 | 9/2016 |

* cited by examiner

HEAT TRANSPORT APPARATUS

CROSS-REFERENCE TO RELATED APPLICATIONS

This application is based upon and claims the benefit of priority from Japanese Patent Application No. 2017-176967, filed on Sep. 14, 2017; the entire contents of which are incorporated herein by reference.

FIELD

Embodiments described herein relate generally to a heat transport apparatus.

BACKGROUND

Conventionally, there has been known a heat transport apparatus, such as a two-phase thermosiphon, that transports heat via a refrigerant.

In this type of heat transport apparatus, it is useful to obtain a novel configuration with less disadvantages.

DETAILED DESCRIPTION

Exemplary embodiments of the present invention will be disclosed below. Configurations of the embodiments described below, and operations and results (effects) due to the configurations are only examples.

Like constituent elements are included in the plurality of embodiments disclosed below. Therefore, in the following descriptions, such like constituent elements are denoted by like reference signs, and redundant explanations thereof are omitted.

First Embodiment

Figure 1:
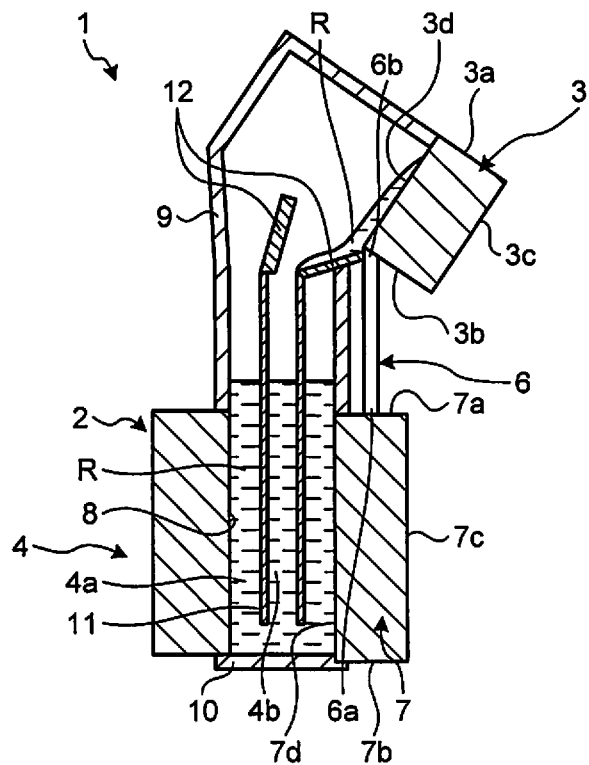
FIG. 1 is a sectional view exemplarily and schematically illustrating a heat transport apparatus according to a first embodiment.

As illustrated in FIG. 1, a heat transport apparatus 1 according to a first embodiment includes an evaporator 2, a cooling unit 3, a channel structure 4, and a heat conductive member 6, for example. The heat transport apparatus 1 is used in a gravity environment. The downward direction in the vertical direction is the gravity direction, and is the downward direction in each drawing.

The evaporator 2 includes a heat-generating element 7 having a tubular shape and an accommodating portion 8 that is provided on the inner peripheral side of the heat-generating element 7 and accommodates a refrigerant R therein, for example. The evaporator 2 vaporizes the refrigerant R in the accommodating portion 8 by heat generated by the heat-generating element 7.

The heat-generating element 7 is a cylindrical body extending in the vertical direction, for example, and has a top surface 7a located on the upper side, a bottom surface 7b located on the lower side, an outer peripheral surface 7c located on the outer peripheral side, and an inner peripheral surface 7d located on the inner peripheral side. A partition wall 9 extends upward from an inner peripheral end of the top surface 7a of the heat-generating element 7. The partition wall 9 isolates inside of the partition wall 9 and outside air from each other. An opening at a lower end of the heat-generating element 7 is closed by a sealing plate 10. In this configuration, the accommodating portion 8 for the refrigerant R is constituted by being surrounded by the sealing plate 10, the inner peripheral surface 7d of the heat-generating element 7, and a lower portion of the partition wall 9. The heat-generating element 7 is a heat-generating portion of a nuclear reactor or an electronic device, for example.

The cooling unit 3 is located above the evaporator 2, and cools and condenses the refrigerant R vaporized by the evaporator 2. The cooling unit 3 has a top surface 3a located on the upper side, a bottom surface 3b located on the lower side, an outer side surface 3c located on the outer peripheral side, and an inner side surface 3d located on the inner peripheral side. The bottom surface 3b is a planar inclined face that extends obliquely downward as proceeding toward the outer peripheral side.

The channel structure 4 constitutes a circulating channel between the evaporator 2 and the cooling unit 3, through which the refrigerant R circulates. In the present embodiment, the channel structure 4 has a double-pipe structure extending substantially along the vertical direction, and constitutes a first channel 4a between the partition wall 9 at the outer side and a flow pipe 11 at the inner side, and a second channel 4b inside the flow pipe 11. In the first channel 4a, the refrigerant R as gas flows upward from the evaporator 2 to the cooling unit 3 by convection. In the second channel 4b, the refrigerant R as liquid flows downward from the cooling unit 3 to the evaporator 2 by gravity.

An upper end of an inflow pipe 12 having a funnel shape, for example, is connected to a lower end of the inner side surface 3d of the cooling unit 3. An upper end of the flow pipe 11 constituting the second channel 4b is connected to a lower end of the inflow pipe 12. The refrigerant R that has changed to liquid on the inner side surface 3d of the cooling unit 3 flows into the second channel 4b in the flow pipe 11 via the inflow pipe 12.

The heat conductive member 6 is separately provided from the channel structure 4 to be parallel to the channel structure 4. The heat conductive member 6 extends in the vertical direction and is thermally connected to both the top surface 7a of the heat-generating element 7 and the bottom surface 3b of the cooling unit 3. Specifically, a lower end portion 6a of the heat conductive member 6 is connected to the top surface 7a of the heat-generating element 7 and an upper end portion 6b is connected to the bottom surface 3b of the cooling unit 3, for example. Further, the heat conductive member 6 is formed of a metal material having high thermal conductivity, such as copper or aluminum. A material having high thermal conductivity may be enclosed in the heat conductive member 6. The heat conductive member 6 may be a heat pipe. The heat conductive member 6 may include a plurality of members arranged in series. The heat conductive member 6 is an example of a heating mechanism.

The refrigerant R is fluid that solidifies at a temperature of a melting point or lower, melts at a temperature of the melting point or higher, and is boiled at a temperature of a boiling point or higher. The refrigerant R is sodium, for example, but is not limited thereto.

Next, an operating state of the heat transport apparatus 1 and a change in a state of the refrigerant R are described with reference to FIGS. 1 to 3.

In a stop state of the heat transport apparatus 1 illustrated in FIG. 1, the refrigerant R is accommodated in the accommodating portion 8 in a liquid or solid state.

Figure 2:
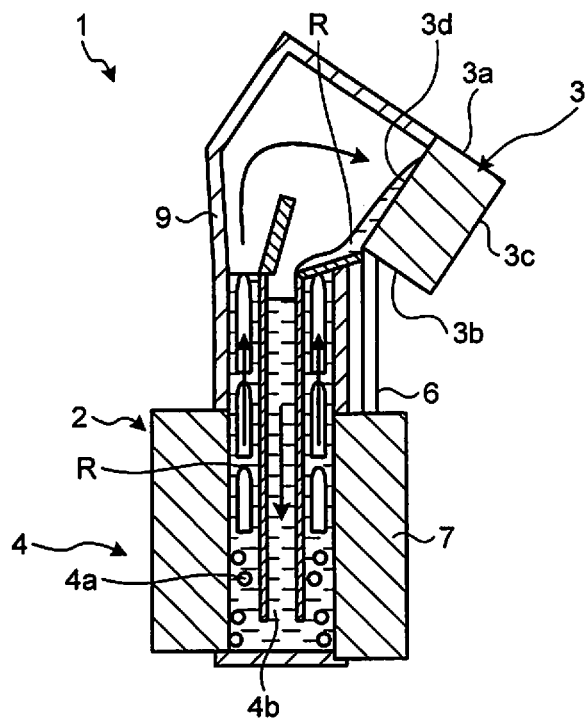
FIG. 2 is a sectional view exemplarily and schematically illustrating the heat transport apparatus according to the first embodiment, illustrating an operation-start state of the heat transport apparatus.

In an operation-start state of the heat transport apparatus 1 illustrated in FIG. 2, the temperature of the heat-generating element 7 rises, and the temperature of the cooling unit 3 falls. In a case where the refrigerant R in the first channel 4a is solid, the refrigerant R is caused to melt to become liquid by heat of the heat-generating element 7. When the temperature of the refrigerant R that is liquid rises to a boiling point or higher because of the heat of the heat-generating element 7, the refrigerant R is boiled and vaporized. The vaporized refrigerant R moves from an upper end of the first channel 4a along the inner side of the partition wall 9 and hits on the inner side surface 3d of the cooling unit 3, as illustrated with an arrow in FIG. 2. Because the cooling unit 3 is cooled to equal to or lower than a melting point of the refrigerant R, the refrigerant R is liquefied on the inner side surface 3d of the cooling unit 3. Therefore, heat exchange occurs between the refrigerant R and the cooling unit 3, so that the refrigerant R is cooled and the cooling unit 3 is heated. Accordingly, heat is transported from the evaporator 2 to the cooling unit 3.

Figure 3:
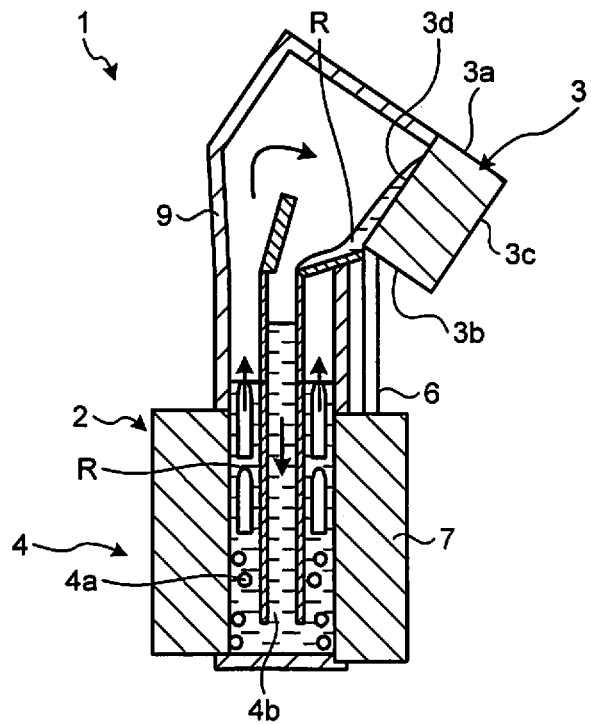
FIG. 3 is a sectional view exemplarily and schematically illustrating the heat transport apparatus according to the first embodiment, illustrating an operating state of the heat transport apparatus.

As illustrated in FIG. 3, the liquefied refrigerant R flows into the second channel 4b from the inner side surface 3d of the cooling unit 3 via the inflow pipe 12, and returns to the accommodating portion 8. In this manner, the refrigerant R is caused to circulate inside the heat transport apparatus 1 in the operating state of FIGS. 2 and 3.

After the heat transport apparatus 1 is stopped, there is a case where the amount of the refrigerant R that solidifies on the inner side surface 3d of the cooling unit 3 increases under a circumstance where the temperature of the cooling unit 3 falls rapidly. In this case, there is a possibility that, when the heat transport apparatus 1 is started, the amount of the refrigerant R present in the accommodating portion 8 is not sufficient and therefore requiring a long time for the heat transport apparatus 1 to become a normal operating state. With regard to this point, the heat transport apparatus 1 according to the present embodiment includes the heat conductive member 6 that conducts heat from the heat-generating element 7 to the cooling unit 3. Therefore, it is possible to suppress rapid temperature drop of the cooling unit 3 by heat conducted from the heat-generating element 7 to the cooling unit 3 via the heat conductive member 6, so that solidification of the refrigerant R at the cooling unit 3 can be suppressed. The refrigerant R not solidifying at the cooling unit 3 moves in the liquid state from the cooling unit 3 to the accommodating portion 8. Therefore, with this configuration, a situation is suppressed in which the refrigerant R is caused to solidify at the cooling unit 3 and therefore the amount of the refrigerant R present in the accommodating portion 8 is not sufficient in startup of the heat transport apparatus 1. In the present embodiment, solidification of the refrigerant R at the cooling unit 3 is suppressed by conducting residual heat of the heat-generating element 7 to the cooling unit 3 via the heat conductive member 6 after the heat transport apparatus 1 is stopped.

As described above, in the present embodiment, the heat transport apparatus 1 includes the heat conductive member 6 (heating mechanism). Therefore, according to the present embodiment, it is possible to suppress solidification of the refrigerant R at the cooling unit 3, for example, and is also possible to suppress startup failure of the heat transport apparatus 1.

Also, in the present embodiment, the heating mechanism is the heat conductive member 6 that transports heat from the heat-generating element 7 to the cooling unit 3, for example. Therefore, it is possible to achieve the heating mechanism with a relatively simple configuration according to the present embodiment.

Second Embodiment

Figure 4:
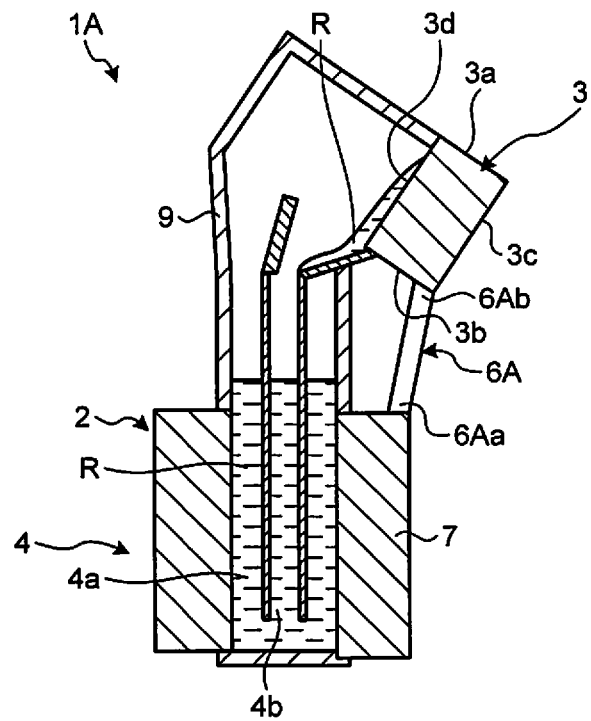
FIG. 4 is a sectional view exemplarily and schematically illustrating a heat transport apparatus according to a second embodiment, illustrating an operation-stop state of the heat transport apparatus.

A heat transport apparatus 1A according to a second embodiment illustrated in FIG. 4 includes an identical configuration to that of the heat transport apparatus 1 according to the first embodiment described above. Therefore, also in the second embodiment, identical results (effects) based on configurations identical to those of the first embodiment described above are obtained.

However, in the second embodiment, the position and the posture of a heat conductive member 6A are changed from those in the first embodiment. The bottom surface 3b of the cooling unit 3 is a planar inclined face that extends obliquely downward as proceeding toward the outer peripheral side, as described above. The top surface 7a of the heat-generating element 7 extends horizontally. A lower end portion 6Aa of the heat conductive member 6A is thermally connected to an outer peripheral end of the top surface 7a of the heat-generating element 7. An upper end portion 6Ab of the heat conductive member 6A is thermally connected to an outer peripheral end of the bottom surface 3b of the cooling unit 3. Therefore, the length of the heat conductive member 6A, which connects the top surface 7a of the heat-generating element 7 and the bottom surface 3b of the cooling unit 3 to each other, is the shortest in a case where the heat conductive member 6A is provided to extend between the outer peripheral end of the top surface 7a of the heat-generating element 7 and the outer peripheral end of the bottom surface 3b of the cooling unit 3, as in the present embodiment.

According to the present embodiment, it is possible to make the length of the heat conductive member 6A connecting the heat-generating element 7 and the cooling unit 3 to each other shorter, for example. Therefore, it is possible to conduct heat from the heat-generating element 7 to the cooling unit 3 more efficiently.

Third Embodiment

Figure 5:
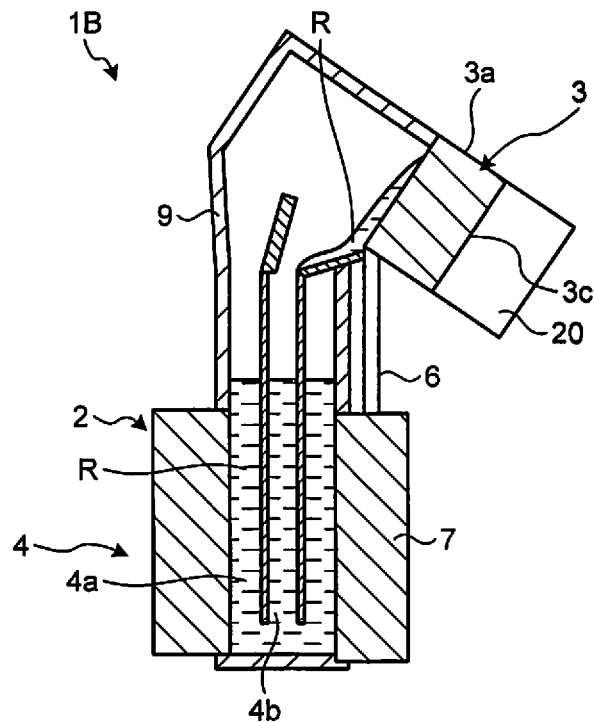
FIG. 5 is a sectional view exemplarily and schematically illustrating a heat transport apparatus according to a third embodiment, illustrating an operation-stop state of the heat transport apparatus.

A heat transport apparatus 1B according to a third embodiment illustrated in FIG. 5 includes an identical configuration to those of the heat transport apparatuses 1 and 1A according to the first and second embodiments described above. Therefore, also in the third embodiment, identical results (effects) based on configurations identical to those of the first and second embodiments described above are obtained.

However, the heat transport apparatus 1B according to the third embodiment includes a heater 20. Specifically, the heater 20 is in contact with the outer side surface 3c of the cooling unit 3. In the present embodiment, it is also possible to heat the cooling unit 3 by the heater 20, in addition to the heat conductive member 6. The heater 20 can be controlled by a heating control unit that executes control in such a manner that a heating state and a heating-stop state of the cooling unit 3 are switched. An operation of the heater 20 is electrically controlled by a control device (not illustrated). The control device can control the heater 20 in such a manner that the heater 20 stops heating while the heat transport apparatus 1B operates, and the heater 20 heats the cooling unit 3 for a predetermined time from a time at which the heat transport apparatus 1B is stopped, for example. Also, the control device can switch between heating and not-heating and can set, change, or control a heating time and a heat-generating amount based on detection results of various sensors. The heater 20 is an example of the heating mechanism.

According to the present embodiment, it is possible to heat the cooling unit 3 more effectively or more efficiently, for example. Although the heater 20 is provided together with the heat conductive member 6 in the present embodiment, an effect of heating by the heater 20 can be also obtained in a configuration where the heater 20 is provided but the heat conductive member 6 is not provided.

Fourth Embodiment

Figure 6:
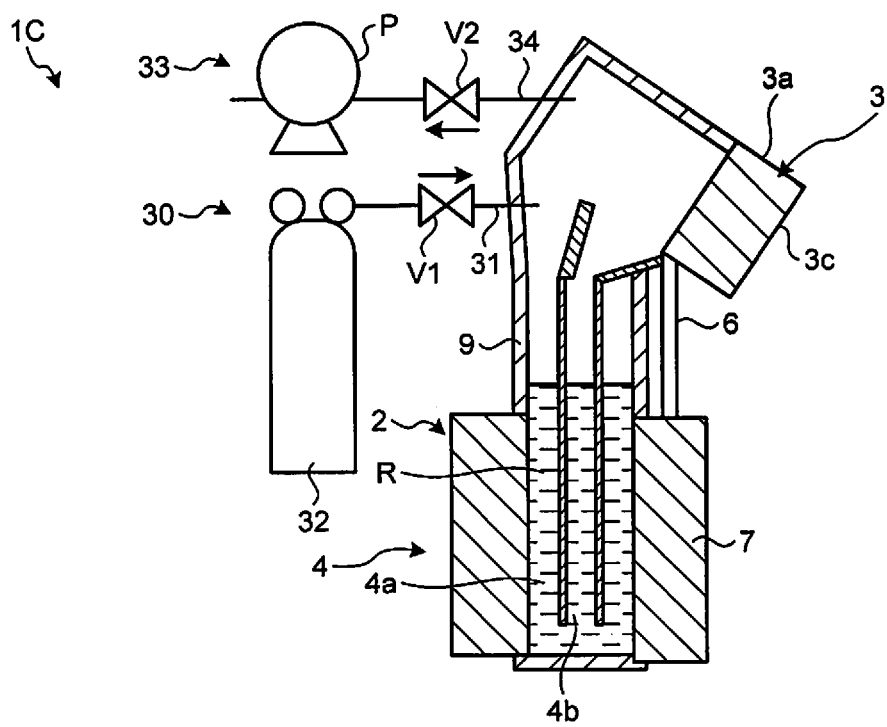
FIG. 6 is a sectional view exemplarily and schematically illustrating a heat transport apparatus according to a fourth embodiment, illustrating a state in which a gas is supplied to the inside of a first channel and a second channel.

A heat transport apparatus 1C according to a fourth embodiment illustrated in FIG. 6 includes an identical configuration to that of the heat transport apparatus 1 according to the first embodiment described above. Therefore, also in the fourth embodiment, identical results (effects) based on configurations identical to those of the first embodiment described above are obtained.

However, in the heat transport apparatus 1C according to the present embodiment, a gas supplying device 30 and a gas discharging device 33 are added to the heat transport apparatus 1 according to the first embodiment.

As illustrated in FIG. 6, the gas supplying device 30 supplies a gas to the inner side of the partition wall 9, that is, inside of the first channel 4a and the second channel 4b. Specifically, the gas supplying device 30 includes a first pipe 31 that supplies a gas to the inner side of the partition wall 9, a first valve V1 provided midway in the first pipe 31, and a gas cylinder 32. One end of the first pipe 31 is inserted through the partition wall 9, and the other end is connected to the gas cylinder 32. The gas supplying device 30 is an example of a pressurizing mechanism. The pressurizing mechanism supplies a gas to the inside of the first channel 4a and the second channel 4b to pressurize the inside of the channels, thereby suppressing solidification of the refrigerant R at the cooling unit 3. The gas is an inert gas that does not react with the refrigerant R, for example, and is nitrogen, argon, or the like.

The gas discharging device 33 discharges the gas in the first channel 4a and the second channel 4b. Specifically, the gas discharging device 33 includes a second pipe 34 that discharges the gas from the inner side of the partition wall 9, a second valve V2 provided midway in the second pipe 34, and a pump P connected to the second pipe 34.

With this configuration, when the second valve V2 is closed and the first valve V1 is opened, a gas is supplied from the gas cylinder 32 into the first channel 4a and the second channel 4b through the first pipe 31. Meanwhile, when the second valve V2 is opened and the pump P is caused to operate while the first valve V1 is closed, the gas in the first channel 4a and the second channel 4b is discharged through the second pipe 34. In a case where an internal pressure in the first channel 4a and the second channel 4b is lower than an external pressure on the outer side of the partition wall 9 when the pressures are compared with each other, for example, in a case of vacuum, it is possible to inject a gas into the first channel 4a and the second channel 4b only by opening the second valve V2. The pump P is a vacuum pump, for example.

Operations of the gas supplying device 30 and the gas discharging device 33 are described below.

Figure 7:
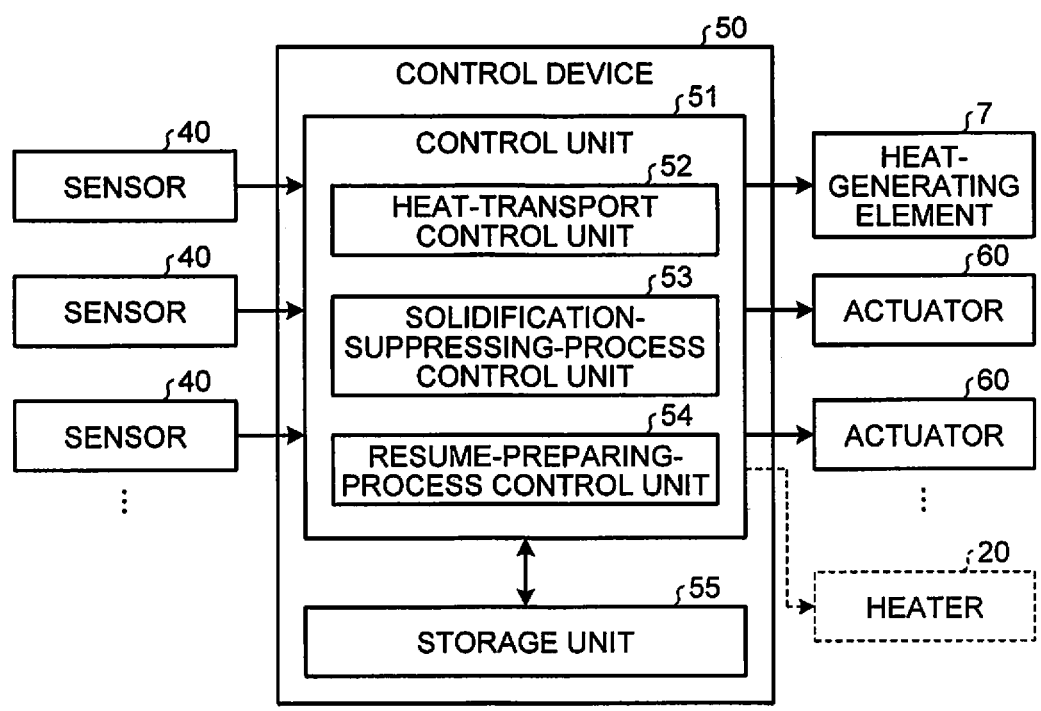
FIG. 7 is a block diagram exemplarily and schematically illustrating a control circuit of the heat transport apparatus according to the fourth embodiment.

As illustrated in FIG. 7, the heat transport apparatus 1C includes sensors 40, a control device 50, actuators 60, and the heat-generating element 7. The sensor 40 is a sensor that detects physical quantity, and is a temperature sensor or a pressure sensor (not illustrated), for example. The temperature sensor is provided in the cooling unit 3 and detects the temperature of the cooling unit 3, for example. The pressure sensor detects the pressure inside the first channel 4a or the second channel 4b, for example. The actuators 60 are the gas supplying device 30 and the gas discharging device 33, for example. Alternatively, the actuator 60 is a solenoid that electrically drives the valves included in the gas supplying device 30 and the gas discharging device 33, or a motor that electrically drives a pump, for example.

The control device 50 is a computer, and is configured as an ECU (electronic control unit), for example. The control device 50 includes a control unit 51 and a storage unit 55. The control unit 51 can realize various functions of the control device 50 by performing arithmetic processing according to an installed program (an application or software). At least a part of functions of the control unit 51 can be realized by hardware such as an ASIC (application specific integrated circuit), an FPGA (field-programmable gate array), a DSP (digital signal processor). The storage unit 55 is, for example, a main storage device or an auxiliary storage device. Further, the control device 50 includes a power supply circuit or a drive circuit (both not illustrated) of the heat-generating element 7 and the actuators 60.

The control unit 51 includes a heat-transport control unit 52, a solidification-suppressing-process control unit 53, and a resume-preparing-process control unit 54. The heat-transport control unit 52 controls the heat-generating element 7 in such a manner that the heat transport apparatus 1C performs predetermined heat transport. The solidification-suppressing-process control unit 53 performs a process for suppressing solidification of the refrigerant R at the cooling unit 3. The resume-preparing-process control unit 54 performs a preparing process for resuming an operation of the heat transport apparatus 1C.

Figure 8:
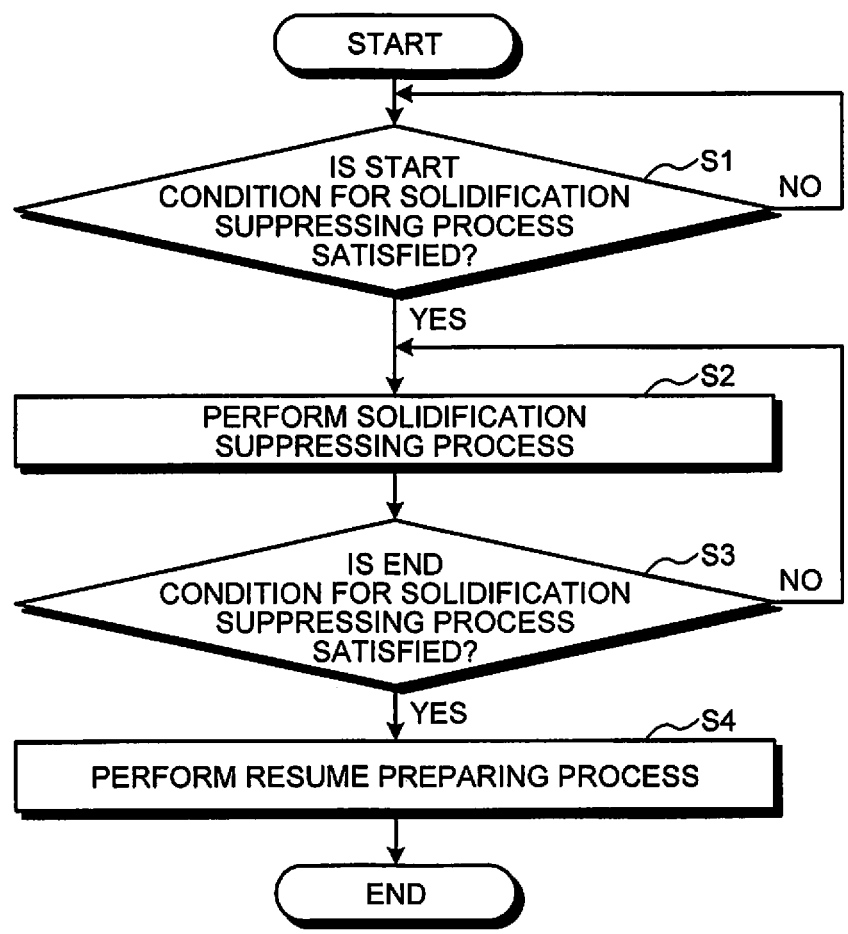
FIG. 8 is a flowchart exemplarily and schematically illustrating an operating procedure of the heat transport apparatus according to the fourth embodiment.

Next, procedures of a solidification suppressing process and a resume preparing process are described with reference to a flowchart of FIG. 8.

First, the control unit 51 functions as the solidification-suppressing-process control unit 53, and determines whether a start condition for the solidification suppressing process is satisfied based on a value of detection by the sensor 40, a signal from another portion in the control device 50, or the like (S1). The start condition at S1 is that an operation of the heat transport apparatus 1C (heat generation control for the heat-generating element 7) is stopped, the detection value of the sensor 40 becomes a threshold value or less, or the like. The start condition based on the detection value of the sensor 40 is that a temperature detected by a temperature sensor that detects the temperature of the cooling unit 3 falls to a predetermined temperature or lower, a pressure detected by a pressure sensor that detects the pressure in the first channel 4a or the second channel 4b reaches a predetermined pressure or higher, or the like. The start condition (threshold value) may be set based on physical quantity or a signal value that indicates a state where it is highly likely that the refrigerant R solidifies or a state where the refrigerant R is about to solidify, or may be set based on physical quantity that indicates a state where solidification of the refrigerant R has actually occurred.

In a case where the start condition for the solidification suppressing process is satisfied at S1 (YES at S1), the control unit 51 functions as the solidification-suppressing-process control unit 53 and performs the solidification suppressing process (S2). At S2, the solidification-suppressing-process control unit 53 controls the actuators 60 that are the gas supplying device 30 and the gas discharging device 33, as the solidification suppressing process, in such a manner that a gas is supplied to the inside of the first channel 4a and the second channel 4b and the pressure in the first channel 4a and the second channel 4b is maintained to be a first predetermined value at which solidification of the refrigerant R does not occur at the cooling unit 3. Specifically, the solidification-suppressing-process control unit 53 controls the actuators 60 to close the second valve V2 and open the first valve V1 first. Also, the solidification-suppressing-process control unit 53 controls the actuators 60 in such a manner that, when being notified by the pressure sensor as the sensor 40 that the pressure in the first channel 4a and the second channel 4b exceeds a first pressure P1 or when a predetermined time has passed after start of the control, the second valve V2 is closed and the first valve V1 is closed. Further, the solidification-suppressing-process control unit 53 controls the actuators 60 in such a manner that, when being notified by the pressure sensor as the sensor 40 that the pressure in the first channel 4a and the second channel 4b falls below a second pressure P2 (<P1), the second valve V2 is closed and the first valve V1 is opened. In a case of NO at S1, the process returns to S1. The solidification-suppressing-process control unit 53 is an example of a pressurization control unit and a pressurizing mechanism.

Next, the control unit 51 functions as the resume-preparing-process control unit 54, and determines whether an end condition for the solidification suppressing process is satisfied based on a signal from another portion in the control device 50 (S3). The end condition at S3 is that a signal instructing start of heat transport control or a signal instructing start of the resume preparing process has been received from the heat-transport control unit 52, for example.

In a case where the end condition for the solidification suppressing process is satisfied at S3 (YES at S3), the control unit 51 functions as the resume-preparing-process control unit 54 and performs the resume preparing process (S4). In a case of NO at S3, the process returns to S2. At S4, the resume-preparing-process control unit 54 controls the actuators 60 that are the gas supplying device 30 and the gas discharging device 33, as the resume preparing process, in such a manner that the gas is discharged from the first channel 4a and the second channel 4b and the pressure in the first channel 4a and the second channel 4b becomes a second predetermined value (<first predetermined value) during an operation of the heat transport apparatus 1C. Specifically, the resume-preparing-process control unit 54 controls the actuators 60 to open the second valve V2 first, close the first valve V1, and cause the pump P to operate. Also, the resume-preparing-process control unit 54 controls the actuators 60 in such a manner that, when being notified by the pressure sensor as the sensor 40 that the pressure in the first channel 4a and the second channel 4b falls below a third pressure P3 or when a predetermined time has passed after start of the control at S4, the second valve V2 is closed, the first valve V1 is closed, and the pump P is stopped. In this case, the second predetermined value is set to a pressure appropriate for vaporization of the refrigerant R in the heat transport apparatus 1C.

As described above, in the present embodiment, the heat transport apparatus 1C includes the gas supplying device 30 and the gas discharging device 33 (pressurizing mechanism) that pressurize inside of the first channel 4a and the second channel 4b (channel) by supplying a gas to the inside of the channels, for example. When the gas is supplied to the inside of the first channel 4a and the second channel 4b, an internal pressure increases and the boiling point of the refrigerant R rises. Vaporization of the refrigerant R is suppressed in the evaporator 2, and supply of the vaporized refrigerant R to the cooling unit 3 is suppressed. Therefore, according to the present embodiment, it is possible to suppress solidification of the refrigerant R at the cooling unit 3, for example.

Further, in the present embodiment, the heat transport apparatus 1C includes, as the pressurizing mechanism, the actuator 60 and the solidification-suppressing-process control unit 53 (pressurization control unit), for example. Therefore, according to the present embodiment, it is possible to suppress solidification by pressurization of a gas in the first channel 4a and the second channel 4b more easily, more precisely, or more efficiently, for example.

In addition, in the present embodiment, the solidification-suppressing-process control unit 53 (pressurization control unit) controls the actuators 60 based on a detection result of the sensor 40 that detects physical quantity, for example. Therefore, according to the present embodiment, it is possible to suppress solidification by pressurization of a gas in the first channel 4a and the second channel 4b more precisely or more efficiently, for example. Although the pressurizing mechanism is provided together with the heat conductive member 6 in the present embodiment, an effect by the pressurizing mechanism can be also obtained in a configuration where the pressurizing mechanism is provided while the heat conductive member 6 is not provided.

Fifth Embodiment

Figure 9:
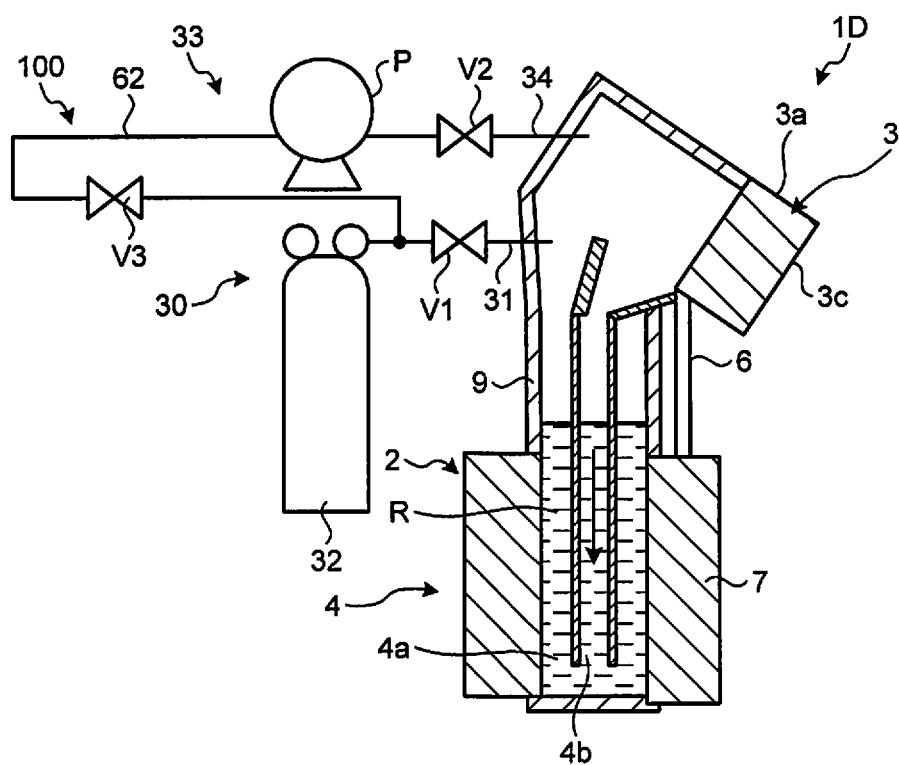
FIG. 9 is a sectional view exemplarily and schematically illustrating a heat transport apparatus according to a fifth embodiment.

A heat transport apparatus 1D according to a fifth embodiment illustrated in FIG. 9 includes an identical configuration to that of the heat transport apparatus 1C according to the fourth embodiment described above. Therefore, also in the fifth embodiment, identical results (effects) based on configurations identical to those of the fourth embodiment described above are obtained.

However, in the heat transport apparatus 1D according to the present embodiment, a third pipe 62 and a third valve V3 are added to the heat transport apparatus 1C according to the fourth embodiment. One end of the third pipe 62 is connected to the pump P, and the other end of the third pipe 62 is connected to a portion between the first valve V1 and the gas cylinder 32 in the first pipe 31. The third valve V3 is provided midway in the third pipe 62.

In the present embodiment, in a case where a gas is discharged from the first channel 4a and the second channel 4b, the first valve V1 is closed, the second valve V2 and the third valve V3 are opened, and the pump P is operated. With this configuration, it is possible to recover the gas discharged from the first channel 4a and the second channel 4b into the gas cylinder 32 and to reuse it in the present embodiment. That is, a reusing structure 100 includes the gas supplying device 30, the gas discharging device 33, the third pipe 62, and the third valve V3, for example.

In the present embodiment, the reusing structure 100 is provided that can recover a gas discharged from the first channel 4a and the second channel 4b (channel) and can supply the gas to the inside of the first channel 4a and the second channel 4b, for example. Therefore, according to the present embodiment, for example, the gas can be effectively used because the gas is not discharged to outside air.

Although embodiments of the present invention have been exemplified above, the above embodiments are only examples, and the scope of the invention is not intended to be limited to these embodiments. These embodiments can be carried out in other various modes, and various omissions, replacements, combinations, and changes can be made without departing from the scope of the present invention. These embodiments are included in the spirit and scope of the invention and are also included in the inventions described in the claims and their equivalents. The present invention can be also realized with configurations other than those disclosed in the above embodiments, and various effects (includes secondary effects) obtained due to basic configurations (technical characteristics) can be obtained. Further, specifications of respective constituent elements (structure, type, direction, shape, dimension, length, width, thickness, height, number, arrangement, position, material, and the like) can be changed as appropriate and carried out.

For example, the cooling unit 3 is illustrated as having a box shape in the embodiments described above. However, the cooling unit 3 may be a unit that includes a metal plate and a fin provided on the metal plate. Further, the heat transport apparatus is a double-pipe two-phase thermosiphon in the embodiments described above. However, it is also possible to include an identical configuration to those in the embodiments described above in a loop-type thermosiphon or a single-pipe thermosiphon, for example. Furthermore, the control device 50 (the control unit 51) may perform a process of heating the cooling unit 3 by the heater 20 (FIGS. 5 and 8) as the solidification suppressing process in the fourth embodiment. In this case, the control unit 51 is an example of a heating control unit. In addition, the gas supplying device 30 may include a pump, an accumulator, or the like in place of the gas cylinder 32. Furthermore, determination of ending the solidification suppressing process in the fourth embodiment and determination of starting the resume preparing process may be performed by using different conditions from each other.

What is claimed is:

1. A heat transport apparatus comprising:
   an evaporator that vaporizes a refrigerant;
   a cooling unit that is provided above the evaporator and cools and condenses the refrigerant vaporized in the evaporator;
   a channel structure that constitutes a channel through which the refrigerant circulates between the evaporator and the cooling unit; and
   a heating mechanism that heats the cooling unit and suppresses solidification of the refrigerant at the cooling unit.

2. The heat transport apparatus according to claim 1, wherein the evaporator includes a heating element and the heating mechanism comprises a heat conductive member that transports heat from the heating element to the cooling unit.

3. The heat transport apparatus according to claim 2, wherein the heat conductive member is provided in parallel with the channel structure between the heating element and an end of the cooling unit close to the heating element.

4. The heat transport apparatus according to claim 1, wherein the heating mechanism includes a heater that heats the cooling unit.

5. The heat transport apparatus according to claim 4, wherein the heating mechanism includes processing circuitry configured to control the heater to switch between a heating state and a heating-stop state of the heater.

6. The heat transport apparatus according to claim 1, further comprising a gas supply that pressurizes inside of the channel by supplying a gas to the inside of the channel, to suppress solidification of the refrigerant at the cooling unit.

7. The heat transport apparatus according to claim 1, wherein the evaporator includes a heating element.

8. The heat transport apparatus according to claim 1, wherein the cooling unit comprises a condenser surface.

9. A heat transport apparatus comprising:
   an evaporator that vaporizes a refrigerant;
   a cooling unit that is provided above the evaporator and cools and condenses the refrigerant vaporized in the evaporator;
   a channel structure that constitutes a channel through which the refrigerant circulates between the evaporator and the cooling unit; and
   a gas supply that pressurizes inside of the channel by supplying a gas to the inside of the channel, to suppress solidification of the refrigerant at the cooling unit.

10. The heat transport apparatus according to claim 9, wherein the gas supply includes an actuator that changes a pressure in the channel and processing circuitry configured to control the actuator to cause the pressure in the channel to be changed.

11. The heat transport apparatus according to claim 10, wherein processing circuitry is further configured to control the actuator based on a detection result of a sensor that detects physical quantity.

12. The heat transport apparatus according to claim 9, wherein the gas supply includes a pump configured to recover a gas discharged from the channel for resupply to the inside of the channel.

13. The heat transport apparatus according to claim 9, wherein the evaporator includes a heating element.

* * * * *